(12) United States Patent
Do et al.

(10) Patent No.: US 8,987,064 B2
(45) Date of Patent: Mar. 24, 2015

(54) INTEGRATED CIRCUIT PACKAGING SYSTEM WITH MOLDED GRID-ARRAY MECHANISM AND METHOD OF MANUFACTURE THEREOF

(71) Applicants: Byung Tai Do, Singapore (SG); Arnel Senosa Trasporto, Singapore (SG); Linda Pei Ee Chua, Singapore (SG)

(72) Inventors: Byung Tai Do, Singapore (SG); Arnel Senosa Trasporto, Singapore (SG); Linda Pei Ee Chua, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 99 days.

(21) Appl. No.: 13/740,151

(22) Filed: Jan. 11, 2013

(65) Prior Publication Data
US 2014/0197548 A1 Jul. 17, 2014

(51) Int. Cl.
H01L 21/00 (2006.01)
H01L 23/48 (2006.01)
H01L 21/56 (2006.01)
H01L 23/495 (2006.01)
H01L 21/48 (2006.01)

(52) U.S. Cl.
CPC ............ H01L 21/56 (2013.01); H01L 23/4951 (2013.01); H01L 23/49582 (2013.01); H01L 21/4832 (2013.01); H01L 2224/32145 (2013.01); H01L 2224/48091 (2013.01); H01L 2224/48247 (2013.01); H01L 2224/73204 (2013.01); H01L 2224/73265 (2013.01)
USPC ........... 438/123; 438/108; 438/124; 438/127; 257/673; 257/693; 257/778; 257/E23.056; 257/E21.511

(58) Field of Classification Search
USPC .......................... 438/111, 112, 123–127, 108; 257/666–677, E23.031–E23.059, 257/E23.049, E23.056, E23.077, E23.116, 257/688, 690, 693, 697, 778, 787, E21.503, 257/E21.511, E23.069
See application file for complete search history.

(56) References Cited

U.S. PATENT DOCUMENTS

| | | | | |
|---|---|---|---|---|
| 6,831,372 B2 * | 12/2004 | Ruhland | ........................ | 257/783 |
| 8,354,744 B2 * | 1/2013 | Lee et al. | ....................... | 257/686 |
| 2009/0206519 A1 | 8/2009 | Hou | | |
| 2012/0280377 A1 | 11/2012 | Do et al. | | |

OTHER PUBLICATIONS

U.S. Appl. No. 13/325,881, filed Dec. 14, 2011, Do et al.
U.S. Appl. No. 13/542,120, filed Jul. 5, 2012, Do et al.

* cited by examiner

*Primary Examiner* — Jasmine Clark
(74) *Attorney, Agent, or Firm* — Ishimaru & Associates LLP

(57) ABSTRACT

A method of manufacture of an integrated circuit packaging system includes: providing a lead-frame having a metal connector mounted thereon and having a peripheral mounting region; forming an insulation cover on the lead-frame and on the metal connector; connecting an integrated circuit die over the insulation cover; forming a top encapsulation on the integrated circuit die with the peripheral mounting region exposed from the top encapsulation; forming a routing layer, having a conductive land, from the lead-frame; and forming a bottom encapsulation partially encapsulating the routing layer and the insulation cover.

20 Claims, 5 Drawing Sheets

US 8,987,064 B2

INTEGRATED CIRCUIT PACKAGING SYSTEM WITH MOLDED GRID-ARRAY MECHANISM AND METHOD OF MANUFACTURE THEREOF

TECHNICAL FIELD

The present invention relates generally to an integrated circuit packaging system, and more particularly to a system having a molded grid-array mechanism.

BACKGROUND ART

Increased miniaturization of components, greater packaging density of integrated circuits ("ICs"), higher performance, and lower cost are ongoing goals of the computer industry. Semiconductor packaging structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, IC packages that are incorporated into these devices are required to be made smaller and thinner. The packaging configurations that house and protect IC require them to be made smaller and thinner as well.

Thus, a need still remains for an integrated circuit packaging system with a molded grid-array mechanism providing low cost manufacturing, improved yields, reduction of integrated circuit packaging dimensions, and flexible stacking and integration configurations. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a lead-frame having a metal connector mounted thereon and having a peripheral mounting region; forming an insulation cover on the lead-frame and on the metal connector; connecting an integrated circuit die over the insulation cover; forming a top encapsulation on the integrated circuit die with the peripheral mounting region exposed from the top encapsulation; forming a routing layer, having a conductive land, from the lead-frame; and forming a bottom encapsulation partially encapsulating the routing layer and the insulation cover.

The present invention provides an integrated circuit packaging system including: a routing layer having a conductive land, a metal connector, and a peripheral mounting region, the metal connector on the conductive land; an insulation cover on the routing layer; an integrated circuit die over the insulation cover; a top encapsulation encapsulating the integrated circuit die with the peripheral mounting region exposed from the top encapsulation; and a bottom encapsulation partially encapsulating the routing layer and the insulation cover.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
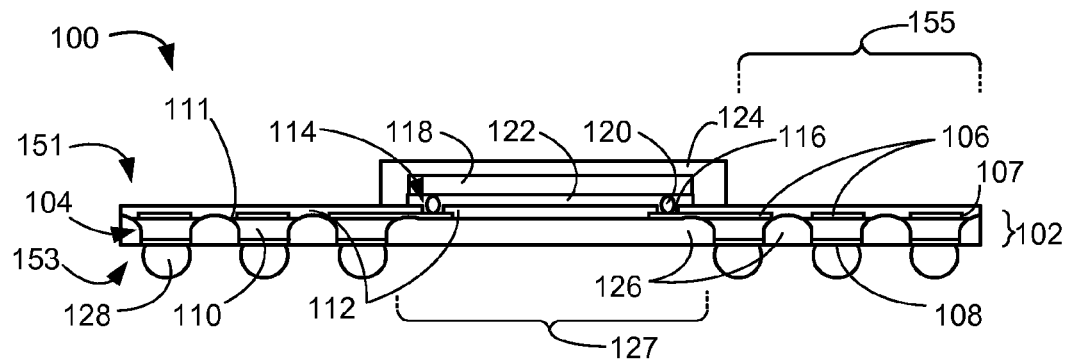
FIG. 1 is a cross-sectional view of an integrated circuit packaging system along a line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGs. The depictions in the FIGs. are arbitrary for the most part. Generally, the invention can be operated in any orientation. In addition, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane of an active surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct physical contact between elements. The term "directly on" means there is direct physical contact between elements with no intervening elements. The term "processing" as used herein includes deposition of material, patterning, exposure, development, etching, cleaning, molding, and/or removal of the material or as required in forming a described structure.

Figure 2:
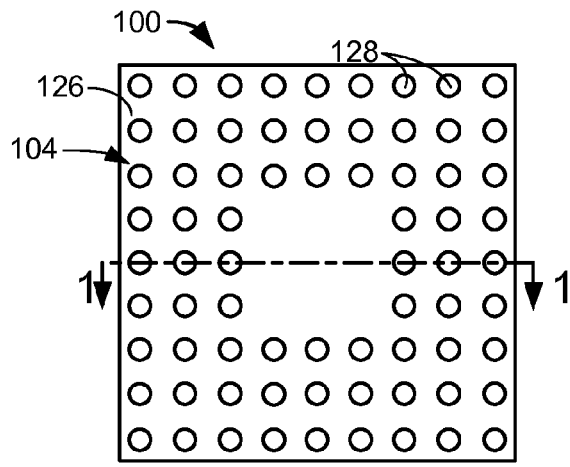
FIG. 2 is a bottom view of the integrated circuit packaging system.

Referring now to FIG. 1, therein is shown a cross-sectional view of an integrated circuit packaging system 100 along a line 1-1 of FIG. 2 in a first embodiment of the present invention. The integrated circuit packaging system 100 includes a routing layer 102.

The routing layer 102 is defined as conductive structures used for routing electrical signals, power, ground, or reference potential for the integrated circuit packaging system 100. The routing layer 102 can route the signals within the integrated circuit packaging system 100, between the integrated circuit packaging system 100 and external components or structures, or a combination thereof. The routing layer 102 can have a conductive land 104 and a metal connector 106.

The conductive land 104 is defined as a conductive portion within the routing layer 102 for routing electrical signals, power, ground, or any reference potential in a non-horizontal direction. The conductive land 104 can be a lead. The conductive land 104 can be located as the lower portion of the routing layer 102 with the metal connector 106 mounted on the conductive land 104. The conductive land 104 can extend in a non-horizontal direction. The conductive land 104 can have a bottom cover 108 and a column portion 110.

The bottom cover 108 is defined as an electrically conductive material for interfacing with components or structures external to the integrated circuit packaging system 100. The bottom cover 108 can be directly on a bottom portion of the column portion 110. The bottom cover 108 can also be used to shape and form the conductive land 104. The manufacturing process of the integrated circuit packaging system 100, including shaping and forming of the conductive land 104 will be discussed in more detail below.

The column portion 110 can be made from any number of materials. For example, the column portion 110 can be made from metal, such as copper or aluminum, or an alloy. The column portion 110 can be electrically conductive. The column portion 110 can have a non-horizontal wall connected to a top surface of the column portion 110 or an overhang portion 111 located at a top portion of the column portion 110.

The non-horizontal wall and the overhang portion 111 of the column portion 110 can join to form an angle or a concave curve and to provide mold locking features. The mold locking features provide structural support to the entire structure of the integrated circuit packaging system 100 by anchoring the conductive land 104 to encapsulations used to protect the integrated circuit packaging system 100.

For example, the overhang portion 111 can have the top surface of the column portion 110 extending past the non-horizontal wall of the column portion 110. The top surface and the bottom surface of the overhang portion 111 can join and form an acute or a right angle. The bottom surface of the overhang portion 111 can extend to and be integral with the non-horizontal wall. The bottom surface of the overhang portion 111 can form an obtuse or a right angle with the non-horizontal wall. The bottom surface of the overhang portion 111 can also form a concaved curved surface with the non-horizontal wall.

The metal connector 106 is a conductive structure for providing an electrical connection between dies, devices, components, packages, or a combination thereof and the conductive land 104. The metal connector 106 can be a trace, a wire, a pad, a connector, or a combination thereof. For illustrative purposes, the metal connector 106 is shown as a trace.

The metal connector 106 is made from a dissimilar metal than the conductive land 104, providing the benefit of holding multiple instances of the conductive land 104 in place during selective etching of a leadframe used to create the conductive land 104. For example, if the conductive land 104 is made from copper, then the metal connector 106 can be made from aluminum, tin, or solder, which would remain intact during a copper etching process.

The metal connector 106 can be directly on a top portion of the conductive land 104. The metal connector 106 can be conductive and extend horizontally for routing electrical signals along a horizontal plane. For example, the metal connector 106 can connect the conductive land 104, another component or structure within the integrated circuit packaging system 100, or a combination thereof. The metal connector 106 can include a lateral edge 107, which includes the sidewalls of the metal connector 106 between the bottom and the top surface of the metal connector 106.

The integrated circuit packaging system 100 can have an insulation cover 112. The insulation cover 112 is defined as a non-conductive material for covering the routing layer 102. For example, the insulation cover 112 can be ceramic, solder resist, dielectric structure, or a combination thereof. The insulation cover 112 can be directly on the routing layer 102. The insulation cover 112 can selectively expose only portions of the routing layer 102 necessary for electrically connecting to other components or structures.

The insulation cover 112 can be directly on a top or side portion of the metal connector 106, a top or side portion of the conductive land 104, or a combination thereof. The insulation cover 112 can extend horizontally and over the metal connector 106, the conductive land 104, or a combination thereof. The insulation cover 112 can cover the top portion of the metal connector 106, the top portion of the conductive land 104, or a combination thereof.

The insulation cover 112 can have a connection opening 114 for selectively connecting components or structures to the metal connector 106, the conductive land 104, or a combination thereof. The connection opening 114 of the insulation cover 112 can expose the metal connector 106, the conductive land 104, or a combination thereof from the insulation cover 112. The insulation cover 112 can partially or completely cover the top portion of the metal connector 106, the top portion of the conductive land 104, or a combination thereof.

The routing layer 102 can have a connection enhancer 116, such as a solder wetable material, in the connection opening 114. The connection enhancer 116 can be on the top portion of the metal connector 106, the top portion of the conductive land 104, or a combination thereof. The connection enhancer 116 can be only on the portions of the metal connector 106, the conductive land 104, or a combination thereof exposed by the connection opening 114.

The integrated circuit packaging system 100 can have an integrated circuit die 118, such as a wire bond die or a flip chip, connected to the metal connector 106 through an internal interconnect 120, such as a bond wire or a solder bump. The integrated circuit die 118 can be attached on the insulation cover 112 and can be over the insulation cover 112, the metal connector 106, the conductive land 104, or a combination thereof. The internal interconnect 120 can be in the connection opening 114 and directly on the integrated circuit die 118, the metal connector 106, the conductive land 104, or a combination thereof.

The integrated circuit packaging system 100 can have an under-fill 122, such as a capillary or a mold type. The under-fill 122 can be between, directly on, or a combination thereof for the integrated circuit die 118, the internal interconnect 120, the insulation cover 112, the metal connector 106, the conductive land 104, or a combination thereof. The under-fill 122 can also be in the connection opening 114. The under-fill 122 provides protection from the environment to the integrated circuit die 118, the internal interconnect 120, the insulation cover 112, and the metal connector 106 below the integrated circuit die 118.

The integrated circuit packaging system 100 can have a top encapsulation 124, a bottom encapsulation 126, and an external interconnect 128. The top encapsulation 124 can be over, encapsulate, be directly on, or a combination thereof for the integrated circuit die 118, the internal interconnect 120, the under-fill 122, a portion of the insulation cover 112, or a combination thereof. The top encapsulation 124 provides a hermetic seal for the integrated circuit die 118 and does not cover an area of the insulation cover 112 directly above the conductive land 104.

The bottom encapsulation 126 can encapsulate and be directly on the conductive land 104 and can be between multiple instances of the conductive land 104. A bottom surface of the bottom encapsulation 126 can be coplanar with a bottom surface of the conductive land 104. A bottom surface of the bottom encapsulation 126 can be coplanar with the bottom cover 108.

The bottom encapsulation 126 can include a die support region 127, which is an area of the bottom encapsulation 126 below the integrated circuit die 118 and between the multiple instances of the conductive land 104 immediately adjacent to the integrated circuit die 118. The die support region 127 provides a platform and structural support for the integrated circuit die 118 and the internal interconnect 120, the under-fill 122, the insulation cover 112, and the metal connector 106 below the integrated circuit die 118.

The top encapsulation 124 and the bottom encapsulation 126 can be formed separately at different times during the manufacturing process. The insulation cover 112, the metal connector 106, the conductive land 104, or a combination thereof can form a continuous horizontal barrier between the top encapsulation 124 and the bottom encapsulation 126, and isolate the two encapsulation structures.

The metal connector 106 can run along or be embedded within a top surface of the bottom encapsulation 126. The lateral edge 107 of the metal connector 106 can be covered by the bottom encapsulation 126, the insulation cover 112, or a combination thereof for providing structural rigidity, anchoring, and physical protection to the metal connector 106.

The external interconnect 128 can be a conductive structure for electrically coupling the integrated circuit packaging system 100 to other structures, such as components or other packages. For example, the external interconnect 128 can be a solder ball, conductive posts, lands, or a combination thereof. The external interconnect 128 can be directly on the bottom portion of the conductive land 104 at the bottom cover 108.

The routing layer 102 can include a component side 151 for mounting components, devices, and packages. The routing layer 102 can also include a system side 153, which is a side opposite to the component side 151, for connecting to a next system level (not shown).

The integrated circuit packaging system 100 can include a peripheral mounting region 155. The peripheral mounting region 155 is the exposed area of a top surface of the insulation cover 112 from an end of the top encapsulation 124 to the outer boundary of the routing layer 102. The peripheral mounting region 155 is laterally adjacent to the top encapsulation 124. The peripheral mounting region 155 is an area for attaching electrical interconnects to the metal connector 106. Multiple instances of the connection opening 114 can be formed in the insulation cover 112 above the conductive land 104 to provide electrical interconnection between components, devices, and packages as needed.

It has been discovered that the metal connector 106 and the insulation cover 112 provide the benefit of holding multiple instances of the conductive land 104 in place during selective etching of the leadframe used to create the conductive land 104 because the metal connector 106 is made from a dissimilar material than the conductive land 104. It has been discovered that the bottom encapsulation 126 provides structural support between the conductive land 104 and another of the conductive land 104.

It has been discovered that the integrated circuit packaging system 100 reduces package height by eliminating the need for a separate platform structure because the bottom encapsulation 126 can provide structural support for the conductive land 104, the metal connector 106, the insulation cover 112, and the integrated circuit die 118. For example, the integrated circuit packaging system 100 can be without an inner support portion, such as a substrate with pre-impregnated layers. It has been discovered that the bottom encapsulation 126 with a thickness equal to or less than the thickness of the routing layer 102 provides reduced package height in package-on-package configurations.

It has been discovered that the insulation cover 112 and the bottom encapsulation 126 prevent physical damage and displacement to the metal connector 106. The insulation cover 112 can cover a top surface of the metal connector 106 and portions of the lateral edge 107 of the metal connector 106, which provides protection and anchoring. The bottom encapsulation 126 can cover a bottom surface of the metal connector 106 and portions of the lateral edge 107 of the metal connector 106, which provides protection and anchoring.

It has been discovered that the bottom encapsulation 126 with the die support region 127 provides support for the integrated circuit die 118, devices, and other components mounted thereon. The die support region 127 eliminates the need for paddles, which reduces the manufacturing complexity, reduces needed materials, and lowers manufacturing costs. It has been discovered that the multiple instances of the conductive land 104 embedded in the bottom encapsulation 126 prevents linear thermal expansion between the multiple instances of the conductive land 104, preventing breakage and warpage of the integrated circuit packaging system 100.

It has been discovered that the insulation cover 112 over the metal connector 106 provides protection against shorts and damages to the metal connector 106 for portions of the metal connector 106 that route into a grid-array away from the top encapsulation 124. It has also been discovered that the conductive land 104 having the overhang portion 111 embedded into the bottom encapsulation 126 provides improved mold lock capability. The overhang portion 111 anchors the conductive land 104 to the bottom encapsulation 126 preventing lead pull-out.

Referring now to FIG. 2, therein is shown a bottom view of the integrated circuit packaging system 100. The integrated circuit packaging system 100 can have instances of the conductive land 104 and the external interconnect 128 arranged along a straight line. The integrated circuit packaging system 100 can also have instances of the conductive land 104 and the external interconnect 128 arranged in a shape of an oval or a rectangle, or in multiple concentric ovals or rectangles. The arrangement of the conductive land 104 and the external interconnect 128 can also be customized for the integrated circuit packaging system 100.

It has been discovered that the conductive land 104, the metal connector 106 of FIG. 1, and the insulation cover 112 of FIG. 1 allow increased design versatility while improving yield and manufacturing cost. The conductive land 104 and the metal connector 106 can be arranged to physically route the signals to any location within a package, while the insulation cover 112 can provide protection and stability to the conductive land 104 and the metal connector 106 within the integrated circuit packaging system 100.

The integrated circuit packaging system 100 can also have the bottom portion of the conductive land 104 exposed between the bottom encapsulation 126 and the external interconnect 128. The external interconnect 128, the bottom encapsulation 126, or a combination thereof can also fully cover the bottom portion of the conductive land 104.

Figure 3:
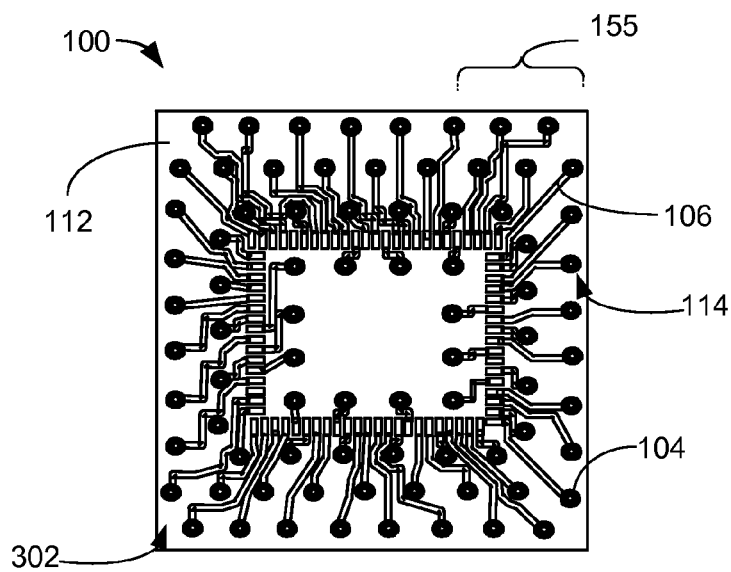
FIG. 3 is an exemplary top view of the integrated circuit packaging system.

Referring now to FIG. 3, therein is shown an exemplary top view of the integrated circuit packaging system 100. The integrated circuit packaging system 100 can have the insulation cover 112 covering a top surface of the routing layer 102 of FIG. 1.

The insulation cover 112 can have the connection opening 114 exposing the metal connector 106 at the conductive land 104. The metal connector 106 can laterally extend from one end of the peripheral mounting region 155 to another end of the peripheral mounting region 155.

The multiple instances of the conductive land 104 can be arranged in a connection pattern 302. The connection pattern 302 can be a regular or patterned shaped array. For example, the connection pattern 302 can have an array shape of a multiple rectangles, circles, and ovals for matching locations of connection points for other devices, packages, components or a combination thereof. Further for example, the connection pattern 302 can be customized or irregular according to a particular design.

It has been discovered that the insulation cover 112 having the connection opening 114 arranged according to the connection pattern 302 prevents shorts and damage to the integrated circuit packaging system 100. The connection pattern 302 and connection opening 114 can be arranged to expose only portions of the integrated circuit packaging system 100 required for connecting to other components or structures and cover other portions to provide protection.

Figure 4:
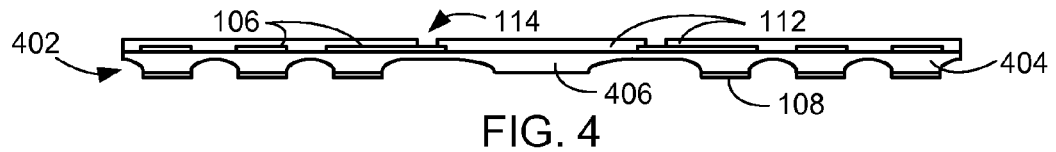
FIG. 4 is a lead-frame for manufacturing the integrated circuit packaging system of FIG. 1.

Referring now to FIG. 4, therein is shown a lead-frame 402 for manufacturing the integrated circuit packaging system 100 of FIG. 1. The lead-frame 402 can be a conductive structure that provides support for various components of the integrated circuit packaging system 100 of FIG. 1 during the manufacturing process. The lead-frame 402 can be a pre-plated frame (PPF) and can be initially shaped or pre-formed.

The lead-frame 402 can have the bottom cover 108 and an inner portion 404, with the bottom cover 108 directly on a bottom surface of the inner portion 404. A portion of the inner portion 404 directly on the bottom cover 108 can be designated for forming the conductive land 104 of FIG. 1. The inner portion 404 can be shaped to form the column portion 110 of FIG. 1 in forming the conductive land 104.

The inner portion 404 can be initially shaped, such as through a chemical etching or metal forming process. The inner portion 404 can be shaped to separate the portion of the lead-frame 402 designated for forming the conductive land 104. The lead-frame 402 can be further shaped to complete the formation of the conductive land 104.

The inner portion 404 can also have a planar bottom surface without the initial shaping process. The lead-frame 402 can have the bottom cover 108 directly on the planar bottom surface of the inner portion 404. The further shaping process can form the conductive land 104 without the initial shaping process. The further shaping process will be discussed in more detail below.

The lead-frame 402 can also have a support portion 406. The support portion 406 is defined as a portion of the lead-frame 402 located horizontally between instances of the bottom cover 108 for providing rigidity to the lead-frame 402 during the manufacturing process. The support portion 406 can be below a portion intended for supporting the integrated circuit die 118 of FIG. 1. The support portion 406 can be absent the bottom cover 108 can be removed during the further shaping process described below. It has been discovered that the lead-frame 402 having the support portion 406 prevents bowing damage during manufacturing to improve yield.

The lead-frame 402 can also have a planar surface or a concave surface horizontally between instances of the bottom cover 108. The lead-frame 402 can have the planar or the concave surfaces only between the instances of the bottom cover 108 without the support portion 406.

The lead-frame 402 can have the metal connector 106. The metal connector 106 can be formed directly on a top surface of the inner portion 404. The metal connector 106 can be patterned according to a design for routing the signals along a horizontal plane.

The insulation cover 112 can be formed, such as through lamination or deposition process, on a top surface of the lead-frame 402. The insulation cover 112 can be formed having the connection opening 114. The connection opening 114 can also be formed by removing portions of the insulation cover 112 after a formation process for the insulation cover 112.

For example, the connection opening 114 can be formed by spacers or mold chases used to form the insulation cover 112. Also, for example, the connection opening 114 can be formed by punching or etching the insulation cover 112.

The insulation cover 112 can be formed covering the top surface of the lead-frame 402. The insulation cover 112 can expose the metal connector 106, the inner portion 404, or a combination thereof through the connection opening 114. The insulation cover 112 can also only expose the metal connector 106, the inner portion 404, or a combination thereof through the connection opening 114.

The insulation cover 112 can also be formed completely covering the top surface of the lead-frame 402. The insulation cover 112 can also expose the metal connector 106, the inner portion 404, or a combination thereof only through the connection opening 114.

The lead-frame 402 can have the connection enhancer 116 of FIG. 1 applied in the connection opening 114. Alternatively, the connection enhancer 116 can be integral with the metal connector 106, the inner portion 404, or a combination thereof. The connection enhancer 116 can be on a top surface of the metal connector 106, a top surface of the inner portion 404, or a combination thereof and exposed through the connection opening 114.

It has been discovered that the lead-frame 402 can have layers of Cu, Ni, Pd, and Au of sufficient thickness and in that respectively order to hold through an etching process. This thickness can be different for the top portion of the lead-frame 402 and different for the bottom portion of the lead-frame 402. For example, the top portion can have a minimum thickness of 0.0020 um for the Au layer, a minimum of 0.020 um to maximum of 0.100 um for the Pd layer, and a minimum of 7.500 um to maximum of 17.500 um for the Ni layer. Further for example, the bottom portion can have a minimum thickness of 0.0020 um for the Au layer, a minimum of 0.020 um to maximum of 0.100 um for the Pd layer, and a minimum of 3.000 um to maximum of 5.000 um for the Ni layer.

Figure 5:
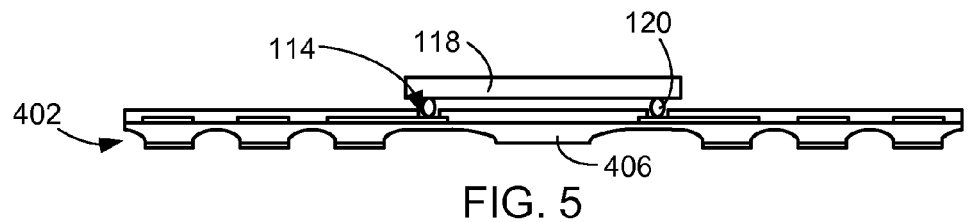
FIG. 5 is the structure of FIG. 4 with the integrated circuit die connected thereon.

Referring now to FIG. 5, therein is shown the structure of FIG. 4 with the integrated circuit die 118 connected thereon. The integrated circuit die 118 can be connected to the lead-frame 402. The integrated circuit die 118 can be attached to the lead-frame 402 directly over and overlapping the support portion 406. The integrated circuit die 118 can be directly on the internal interconnect 120, which can be directly on the lead-frame 402.

The lead-frame 402 can also have a planar surface or a concave surface horizontally between instances of the bottom cover 108 of FIG. 1 instead of the support portion 406. The integrated circuit die 118 can be attached to the lead-frame 402 directly over and overlapping the planar or concave surface.

The internal interconnect 120 can be in the connection opening 114 and directly on the lead-frame 402. It has been discovered that the internal interconnect 120 in the connection opening 114 prevents shorts that can be created during the manufacturing process. The connection opening 114 can contain the internal interconnect 120 from moving horizontally during any intended or unintended reflow or reshaping of the internal interconnect 120.

Figure 6:
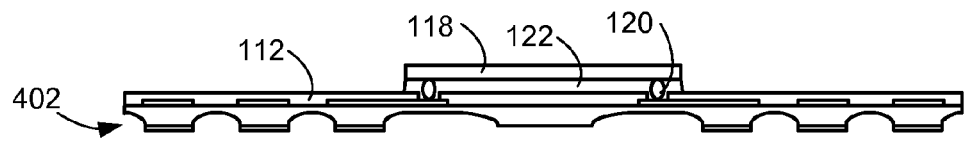
FIG. 6 is the structure of FIG. 5 with the under-fill applied thereon.

Referring now to FIG. 6, therein is shown the structure of FIG. 5 with the under-fill 122 applied thereon. The under-fill 122 can be applied between the integrated circuit die 118, the internal interconnect 120, the lead-frame 402, the insulation cover 112, or a combination thereof. The under-fill 122 can directly contact the integrated circuit die 118, the internal interconnect 120, the lead-frame 402, the insulation cover 112, or a combination thereof.

Figure 7:
FIG. 7 is the structure of FIG. 6 with the top encapsulation formed thereon.

Referring now to FIG. 7, therein is shown the structure of FIG. 6 with the top encapsulation 124 formed thereon. The top encapsulation 124 can be formed on the integrated circuit die 118. The top encapsulation 124 does not cover the multiple instances of the metal connector 106 of FIG. 1 exposed from the connection opening 114 of FIG. 1 at the peripheral mounting region 155 of FIG. 1, leaving the peripheral mounting region 155 exposed for mounting other devices, components, or a combination thereof.

Figure 8:
FIG. 8 is the structure of FIG. 7 in a land-creation process of manufacture.

Referring now to FIG. 8, therein is shown the structure of FIG. 7 in a land-creation process of manufacture. The lead-frame 402 of FIG. 7 can be further shaped to form the conductive land 104. The bottom cover 108 can be used as a mask for the shaping process.

For example, an etching process or a metal shaping process can remove portions of the inner portion 404 of FIG. 4 horizontally between instances of the bottom cover 108. The inner portion 404 can become the column portion 110 of FIG. 1 after the shaping process to form the conductive land 104.

The portions of the lead-frame 402 not having the bottom cover 108 can be removed. For example, the support portion 406 of FIG. 4, other portions horizontally between the bottom cover 108, or a combination thereof can be removed during the shaping process. A bottom surface for a portion of the insulation cover 112 directly under the integrated circuit die 118 of FIG. 1, portions of the insulation cover 112 horizontally between the bottom cover 108, or a combination thereof can be exposed from material remaining from the lead-frame 402, such as the conductive land 104.

The removal of the inner portion 404 can expose the insulation cover 112 between instances of the conductive land 104. The insulation cover 112 between the instances of the conductive land 104 can have a planar surface extending between and surrounding the instances of the conductive land 104. The insulation cover 112 can also form a recess between the instances of the conductive land 104.

The further shaping process can form the overhang portion 111 of the column portion 110. The overhang portion 111 can be a characteristic of shaping the lead-frame 402 from the bottom only, which preserves the top planar surface of the conductive land 104 and extending through the overhang portion 111. Further, the overhang portion 111 can be formed on the top portion of the column portion 110 as a characteristic of shaping the lead-frame 402 from only the bottom.

Figure 9:
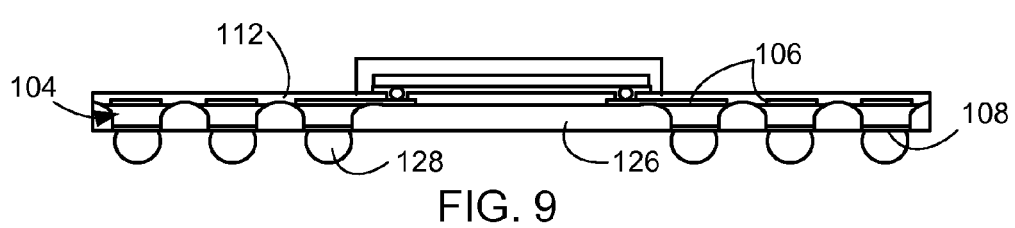
FIG. 9 is the structure of FIG. 8 with the bottom encapsulation and the external interconnect formed thereon.

Referring now to FIG. 9, therein is shown the structure of FIG. 8 with the bottom encapsulation 126 and the external interconnect 128 formed thereon. The bottom encapsulation 126 can be formed directly on the insulation cover 112, the conductive land 104, the metal connector 106, or a combination thereof.

A bottom surface of the bottom encapsulation 126 can be coplanar with a bottom surface of the bottom cover 108. The bottom surface of the bottom encapsulation 126 can also be below or above the bottom surface of the bottom cover 108. The external interconnect 128 can be formed directly on the bottom surface of the bottom cover 108 and horizontally between portions of the bottom encapsulation 126.

Figure 10:
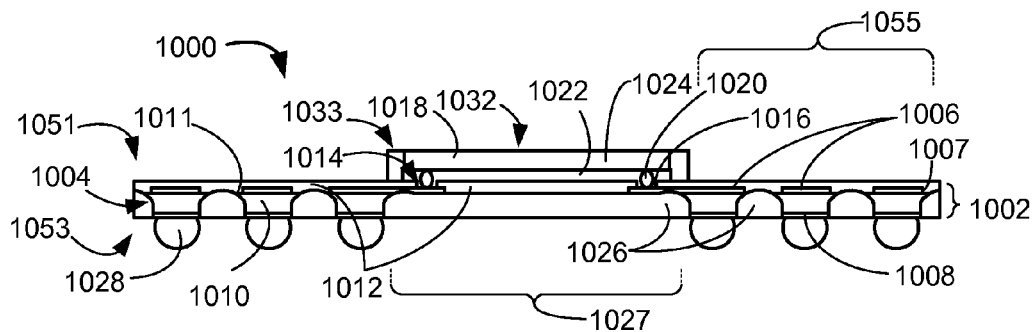
FIG. 10 is a cross-sectional view of an integrated circuit packaging system along a line 1-1 of FIG. 2 in a second embodiment of the present invention.

Referring now to FIG. 10, therein is shown a cross-sectional view of an integrated circuit packaging system 1000 along a line 1-1 of FIG. 2 in a second embodiment of the present invention. The integrated circuit packaging system 1000 includes a routing layer 1002.

The routing layer 1002 is defined as conductive structures used for routing electrical signals, power, ground, or reference potential for the integrated circuit packaging system 1000. The routing layer 1002 can route the signals within the integrated circuit packaging system 1000, between the integrated circuit packaging system 1000 and external components or structures, or a combination thereof. The routing layer 1002 can have a conductive land 1004 and a metal connector 1006.

The conductive land 1004 is defined as a conductive portion within the routing layer 1002 for routing electrical signals, power, ground, or any reference potential in a non-horizontal direction. The conductive land 1004 can be a lead. The conductive land 1004 can be located as the lower portion of the routing layer 1002 with the metal connector 1006 mounted on the conductive land 1004. The conductive land 1004 can extend in a non-horizontal direction. The conductive land 1004 can have a bottom cover 1008 and a column portion 1010.

The bottom cover 1008 is defined as an electrically conductive material for interfacing with components or structures external to the integrated circuit packaging system 1000. The bottom cover 1008 can be directly on a bottom portion of the column portion 1010. The bottom cover 1008 can also be used to shape and form the conductive land 1004. The manufacturing process of the integrated circuit packaging system 1000, including shaping and forming of the conductive land 1004 will be discussed in more detail below.

The column portion 1010 can be made from any number of materials. For example, the column portion 1010 can be made from metal, such as copper or aluminum, or an alloy. The column portion 1010 can be electrically conductive. The column portion 1010 can have a non-horizontal wall connected to a top surface of the column portion 1010 or an overhang portion 1011 located at a top portion of the column portion 1010.

The non-horizontal wall and the overhang portion 1011 of the column portion 1010 can join to form an angle or a concave curve and to provide mold locking features. The mold locking features provide structural support to the entire structure of the integrated circuit packaging system 1000 by anchoring the conductive land 1004 to encapsulations used to protect the integrated circuit packaging system 1000.

For example, the overhang portion 1011 can have the top surface of the column portion 1010 extending past the non-horizontal wall of the column portion 1010. The top surface and the bottom surface of the overhang portion 1011 can join and form an acute or a right angle. The bottom surface of the overhang portion 1011 can extend to and be integral with the non-horizontal wall. The bottom surface of the overhang portion 1011 can form an obtuse or a right angle with the non-horizontal wall. The bottom surface of the overhang portion 1011 can also form a concaved curved surface with the non-horizontal wall.

The metal connector 1006 is a conductive structure for providing an electrical connection between dies, devices, components, packages, or a combination thereof and the conductive land 1004. The metal connector 1006 can be a trace, a wire, a pad, a connector, or a combination thereof. For illustrative purposes, the metal connector 1006 is shown as a trace.

The metal connector 1006 is made from a dissimilar metal than the conductive land 1004, providing the benefit of holding multiple instances of the conductive land 1004 in place during selective etching of a leadframe used to create the conductive land 1004. For example, if the conductive land 1004 is made from copper, then the metal connector 1006 can be made from aluminum, tin, or solder, which would remain intact during a copper etching process.

The metal connector 1006 can be directly on a top portion of the conductive land 1004. The metal connector 1006 can be conductive and extend horizontally for routing electrical signals along a horizontal plane. For example, the metal connector 1006 can connect the conductive land 1004, another component or structure within the integrated circuit packaging system 1000, or a combination thereof. The metal connector 1006 can include a lateral edge 1007, which includes the sidewalls of the metal connector 1006 between the bottom and the top surface of the metal connector 1006.

The integrated circuit packaging system 1000 can have an insulation cover 1012. The insulation cover 1012 is defined as a non-conductive material for covering the routing layer 1002. For example, the insulation cover 1012 can be ceramic, solder resist, dielectric structure, or a combination thereof. The insulation cover 1012 can be directly on the routing layer 1002. The insulation cover 1012 can selectively expose only portions of the routing layer 1002 necessary for electrically connecting to other components or structures.

The insulation cover 1012 can be directly on a top or side portion of the metal connector 1006, a top or side portion of the conductive land 1004, or a combination thereof. The insulation cover 1012 can extend horizontally and over the metal connector 1006, the conductive land 1004, or a combination thereof. The insulation cover 1012 can cover the top portion of the metal connector 1006, the top portion of the conductive land 1004, or a combination thereof.

The insulation cover 1012 can have a connection opening 1014 for selectively connecting components or structures to the metal connector 1006, the conductive land 1004, or a combination thereof. The connection opening 1014 of the insulation cover 1012 can expose the metal connector 1006, the conductive land 1004, or a combination thereof from the insulation cover 1012. The insulation cover 1012 can partially or completely cover the top portion of the metal connector 1006, the top portion of the conductive land 1004, or a combination thereof.

The routing layer 1002 can have a connection enhancer 1016, such as a solder wetable material, in the connection opening 1014. The connection enhancer 1016 can be on the top portion of the metal connector 1006, the top portion of the conductive land 1004, or a combination thereof. The connection enhancer 1016 can be only on the portions of the metal connector 1006, the conductive land 1004, or a combination thereof exposed by the connection opening 1014.

The integrated circuit packaging system 1000 can have an integrated circuit die 1018, such as a wire bond die or a flip chip, connected to the metal connector 1006 through an internal interconnect 1020, such as a bond wire or a solder bump. The integrated circuit die 1018 can be attached on the insulation cover 1012 and can be over the insulation cover 1012, the metal connector 1006, the conductive land 1004, or a combination thereof. The internal interconnect 1020 can be in the connection opening 1014 and directly on the integrated circuit die 1018, the metal connector 1006, the conductive land 1004, or a combination thereof.

The integrated circuit die 1018 can include a top chip surface 1032, which is a surface of the integrated circuit die 1018 facing away from the routing layer 1002. The top chip surface 1032 can be the inactive side of a flip chip.

The integrated circuit packaging system 1000 can have an under-fill 1022, such as a capillary or a mold type. The under-fill 1022 can be between, directly on, or a combination thereof for the integrated circuit die 1018, the internal interconnect 1020, the insulation cover 1012, the metal connector 1006, the conductive land 1004, or a combination thereof. The under-fill 1022 can also be in the connection opening 1014. The under-fill 1022 provides protection from the environment to the integrated circuit die 1018, the internal interconnect 1020, the insulation cover 1012, and the metal connector 1006 below the integrated circuit die 1018.

The integrated circuit packaging system 1000 can have a top encapsulation 1024, a bottom encapsulation 1026, and an external interconnect 1028. The top encapsulation 1024 can be over, encapsulate, be directly on, or a combination thereof for the integrated circuit die 1018, the internal interconnect 1020, the under-fill 1022, a portion of the insulation cover 1012, or a combination thereof. The top encapsulation 1024 provides a hermetic seal for the integrated circuit die 1018 and does not cover an area of the insulation cover 1012 directly above the conductive land 1004.

The top encapsulation 1024 can have a top mold surface 1033, which is a surface of the top encapsulation 1024 facing an opposite direction from the routing layer 1002. The top encapsulation 1024 can be similar to the top encapsulation 124 of FIG. 1 except that the top encapsulation 1024 can be back-grinded to expose the top chip surface 1032 from the top encapsulation 1024.

The top mold surface 1033 can be coplanar with the top chip surface 1032. It has been discovered that having the top mold surface 1033 of the top encapsulation 1024 coplanar with the top chip surface 1032 of the integrated circuit die 1018 provides for a lower profile height while maintaining structural integrity for the integrated circuit packaging system 1000.

The bottom encapsulation 1026 can encapsulate and be directly on the conductive land 1004 and can be between multiple instances of the conductive land 1004. A bottom surface of the bottom encapsulation 1026 can be coplanar with a bottom surface of the conductive land 1004. A bottom surface of the bottom encapsulation 1026 can be coplanar with the bottom cover 1008.

The bottom encapsulation 1026 can include a die support region 1027, which is an area of the bottom encapsulation 1026 below the integrated circuit die 1018 and between the multiple instances of the conductive land 1004 immediately adjacent to the integrated circuit die 1018. The die support region 1027 provides a platform and structural support for the integrated circuit die 1018 and the internal interconnect 1020, the under-fill 1022, the insulation cover 1012, and the metal connector 1006 below the integrated circuit die 1018.

The top encapsulation 1024 and the bottom encapsulation 1026 can be formed separately at different times during the manufacturing process. The insulation cover 1012, the metal connector 1006, the conductive land 1004, or a combination thereof can form a continuous horizontal barrier between the top encapsulation 1024 and the bottom encapsulation 1026, and isolate the two encapsulation structures.

The metal connector 1006 can run along or be embedded within a top surface of the bottom encapsulation 1026. The lateral edge 1007 of the metal connector 1006 can be covered by the bottom encapsulation 1026, the insulation cover 1012, or a combination thereof for providing structural rigidity, anchoring, and physical protection to the metal connector 1006.

The external interconnect 1028 can be a conductive structure for electrically coupling the integrated circuit packaging system 1000 to other structures, such as components or other packages. For example, the external interconnect 1028 can be a solder ball, conductive posts, lands, or a combination thereof. The external interconnect 1028 can be directly on the bottom portion of the conductive land 1004 at the bottom cover 1008.

The routing layer 1002 can include a component side 1051 for mounting components, devices, and packages. The routing layer 1002 can also include a system side 1053, which is a side opposite to the component side 1051, for connecting to a next system level (not shown).

The integrated circuit packaging system 1000 can include a peripheral mounting region 1055. The peripheral mounting region 1055 is the exposed area of a top surface of the insulation cover 1012 from an end of the top encapsulation 1024 to the outer boundary of the routing layer 1002. The peripheral mounting region 1055 is an area for attaching electrical interconnects to the metal connector 1006. Multiple instances of the connection opening 1014 can be formed in the insulation cover 1012 above the conductive land 1004 to provide electrical interconnection between components, devices, and packages as needed.

It has been discovered that the metal connector 1006 and the insulation cover 1012 provide the benefit of holding multiple instances of the conductive land 1004 in place during selective etching of the leadframe used to create the conductive land 1004 because the metal connector 1006 is made from a dissimilar material than the conductive land 1004. It has been discovered that the bottom encapsulation 1026 provides structural support between the conductive land 1004 and another of the conductive land 1004.

It has been discovered that the integrated circuit packaging system 1000 reduces package height by eliminating the need for a separate platform structure because the bottom encapsulation 1026 can provide structural support for the conductive land 1004, the metal connector 1006, the insulation cover 1012, and the integrated circuit die 1018. For example, the integrated circuit packaging system 1000 can be without an inner support portion, such as a substrate with pre-impregnated layers. It has been discovered that the bottom encapsulation 1026 with a thickness equal to or less than the thickness of the routing layer 1002 provides reduced package height in package-on-package configurations.

It has been discovered that the insulation cover 1012 and the bottom encapsulation 1026 prevent physical damage and displacement to the metal connector 1006. The insulation cover 1012 can cover a top surface of the metal connector 1006 and portions of the lateral edge 1007 of the metal connector 1006, which provides protection and anchoring. The bottom encapsulation 1026 can cover a bottom surface of the metal connector 1006 and portions of the lateral edge 1007 of the metal connector 1006, which provides protection and anchoring.

It has been discovered that the bottom encapsulation 1026 with the die support region 1027 provides support for the integrated circuit die 1018, devices, and other components mounted thereon. The die support region 1027 eliminates the need for paddles, which reduces the manufacturing complexity, reduces needed materials, and lowers manufacturing costs. It has been discovered that the multiple instances of the conductive land 1004 embedded in the bottom encapsulation 1026 prevents linear thermal expansion between the multiple instances of the conductive land 1004, preventing breakage and warpage of the integrated circuit packaging system 1000.

It has been discovered that the insulation cover 1012 over the metal connector 1006 provides protection against shorts and damages to the metal connector 1006 for portions of the metal connector 1006 that route into a grid-array away from the top encapsulation 1024. It has also been discovered that the conductive land 1004 having the overhang portion 1011 embedded into the bottom encapsulation 1026 provides improved mold lock capability. The overhang portion 1011 anchors the conductive land 1004 to the bottom encapsulation 1026 preventing lead pull-out.

Figure 11:
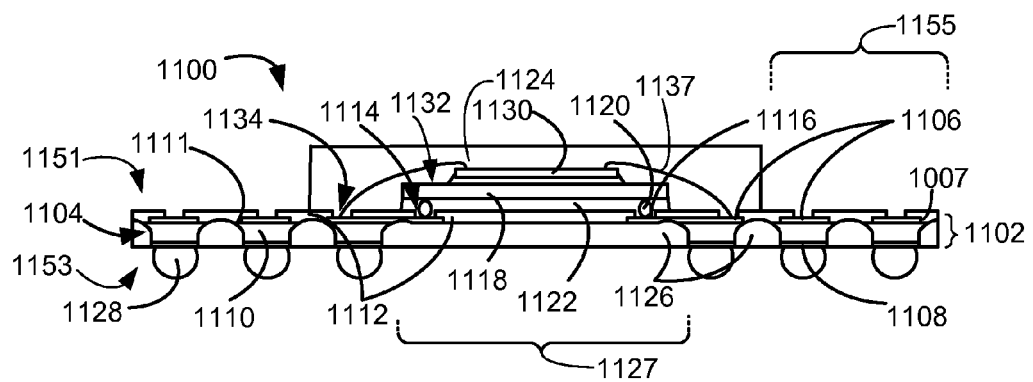
FIG. 11 is a cross-sectional view of an integrated circuit packaging system along a line 1-1 of FIG. 2 in a third embodiment of the present invention.

Referring now to FIG. 11, therein is shown a cross-sectional view of an integrated circuit packaging system 1100 along a line 1-1 of FIG. 2 in a third embodiment of the present invention. The integrated circuit packaging system 1100 includes a routing layer 1102.

The routing layer 1102 is defined as conductive structures used for routing electrical signals, power, ground, or reference potential for the integrated circuit packaging system 1100. The routing layer 1102 can route the signals within the integrated circuit packaging system 1100, between the integrated circuit packaging system 1100 and external components or structures, or a combination thereof. The routing layer 1102 can have a conductive land 1104 and a metal connector 1106.

The conductive land 1104 is defined as a conductive portion within the routing layer 1102 for routing electrical signals, power, ground, or any reference potential in a non-horizontal direction. The conductive land 1104 can be a lead.

The conductive land 1104 can be located as the lower portion of the routing layer 1102 with the metal connector 1106 mounted on the conductive land 1104. The conductive land 1104 can extend in a non-horizontal direction. The conductive land 1104 can have a bottom cover 1108 and a column portion 1110.

The bottom cover 1108 is defined as an electrically conductive material for interfacing with components or structures external to the integrated circuit packaging system 1100. The bottom cover 1108 can be directly on a bottom portion of the column portion 1110. The bottom cover 1108 can also be used to shape and form the conductive land 1104. The manufacturing process of the integrated circuit packaging system 1100, including shaping and forming of the conductive land 1104 will be discussed in more detail below.

The column portion 1110 can be made from any number of materials. For example, the column portion 1110 can be made from metal, such as copper or aluminum, or an alloy. The column portion 1110 can be electrically conductive. The column portion 1110 can have a non-horizontal wall connected to a top surface of the column portion 1110 or an overhang portion 1111 located at a top portion of the column portion 1110.

The non-horizontal wall and the overhang portion 1111 of the column portion 1110 can join to form an angle or a concave curve and to provide mold locking features. The mold locking features provide structural support to the entire structure of the integrated circuit packaging system 1100 by anchoring the conductive land 1104 to encapsulations used to protect the integrated circuit packaging system 1100.

For example, the overhang portion 1111 can have the top surface of the column portion 1110 extending past the non-horizontal wall of the column portion 1110. The top surface and the bottom surface of the overhang portion 1111 can join and form an acute or a right angle. The bottom surface of the overhang portion 1111 can extend to and be integral with the non-horizontal wall. The bottom surface of the overhang portion 1111 can form an obtuse or a right angle with the non-horizontal wall. The bottom surface of the overhang portion 1111 can also form a concaved curved surface with the non-horizontal wall.

The metal connector 1106 is a conductive structure for providing an electrical connection between dies, devices, components, packages, or a combination thereof and the conductive land 1104. The metal connector 1106 can be a trace, a wire, a pad, a connector, or a combination thereof. For illustrative purposes, the metal connector 1106 is shown as a trace.

The metal connector 1106 is made from a dissimilar metal than the conductive land 1104, providing the benefit of holding multiple instances of the conductive land 1104 in place during selective etching of a leadframe used to create the conductive land 1104. For example, if the conductive land 1104 is made from copper, then the metal connector 1106 can be made from aluminum, tin, or solder, which would remain intact during a copper etching process.

The metal connector 1106 can be directly on a top portion of the conductive land 1104. The metal connector 1106 can be conductive and extend horizontally for routing electrical signals along a horizontal plane. For example, the metal connector 1106 can connect the conductive land 1104, another component or structure within the integrated circuit packaging system 1100, or a combination thereof. The metal connector 1106 can include a lateral edge 1107, which includes the sidewalls of the metal connector 1106 between the bottom and the top surface of the metal connector 1106.

The integrated circuit packaging system 1100 can have an insulation cover 1112. The insulation cover 1112 is defined as a non-conductive material for covering the routing layer 1102. For example, the insulation cover 1112 can be ceramic, solder resist, dielectric structure, or a combination thereof. The insulation cover 1112 can be directly on the routing layer 1102. The insulation cover 1112 can selectively expose only portions of the routing layer 1102 necessary for electrically connecting to other components or structures.

The insulation cover 1112 can be directly on a top or side portion of the metal connector 1106, a top or side portion of the conductive land 1104, or a combination thereof. The insulation cover 1112 can extend horizontally and over the metal connector 1106, the conductive land 1104, or a combination thereof. The insulation cover 1112 can cover the top portion of the metal connector 1106, the top portion of the conductive land 1104, or a combination thereof.

The insulation cover 1112 can have a connection opening 1114 for selectively connecting components or structures to the metal connector 1106, the conductive land 1104, or a combination thereof. The connection opening 1114 of the insulation cover 1112 can expose the metal connector 1106, the conductive land 1104, or a combination thereof from the insulation cover 1112. The insulation cover 1112 can partially or completely cover the top portion of the metal connector 1106, the top portion of the conductive land 1104, or a combination thereof.

The routing layer 1002 can have a connection enhancer 1116, such as a solder wetable material, in the connection opening 1114. The connection enhancer 1116 can be on the top portion of the metal connector 1106, the top portion of the conductive land 1104, or a combination thereof. The connection enhancer 1116 can be only on the portions of the metal connector 1106, the conductive land 1104, or a combination thereof exposed by the connection opening 1114.

The integrated circuit packaging system 1100 can have an integrated circuit die 1118, such as a wire bond die or a flip chip, connected to the metal connector 1106 through an internal interconnect 1120, such as a bond wire or a solder bump. The integrated circuit die 1118 can be attached on the insulation cover 1112 and can be over the insulation cover 1112, the metal connector 1106, the conductive land 1104, or a combination thereof. The internal interconnect 1120 can be in the connection opening 1114 and directly on the integrated circuit die 1118, the metal connector 1106, the conductive land 1104, or a combination thereof.

The integrated circuit die 1118 can include a top chip surface 1132, which is a surface of the integrated circuit die 1118 facing away from the routing layer 1102. The top chip surface 1132 can be the inactive side of a flip chip.

The integrated circuit packaging system 1100 can have an under-fill 1122, such as a capillary or a mold type. The under-fill 1122 can be between, directly on, or a combination thereof for the integrated circuit die 1118, the internal interconnect 1120, the insulation cover 1112, the metal connector 1106, the conductive land 1104, or a combination thereof. The under-fill 1122 can also be in the connection opening 1114. The under-fill 1122 provides protection from the environment to the integrated circuit die 1118, the internal interconnect 1120, the insulation cover 1112, and the metal connector 1106 below the integrated circuit die 1118.

The integrated circuit packaging system 1100 can be similar to the integrated circuit packaging system 100 of FIG. 1, except the integrated circuit packaging system 1100 can have a further die 1130 mounted on the integrated circuit die 1118. The further die 1130, such as a wire bond die or a flip chip, and a further internal-connector 1137, such as a bond wire or a conductive post. The further die 1130 can be mounted on the integrated circuit die 1118. The further die 1130 can have horizontal dimensions that are smaller or greater than those of the integrated circuit die 1118. The further die 1130 can be mounted centered with or off-center from the integrated circuit die 1118. A portion of the further die 1130 can extend past a periphery edge of the integrated circuit die 1118 to create a die overhang portion.

The further internal-connector 1137 can be directly on the further die 1130, the integrated circuit die 1118, the metal connector 1106, the conductive land 1104 or a combination thereof. The further internal-connector 1137 can be connected to the routing layer 1102 through the connection opening 1114, a further opening 1134, or a combination thereof of the insulation cover 1112. The further opening 1134 can be similar to the connection opening 1114 and expose the routing layer 1102 from the insulation cover 1112. The further internal-connector 1137 can be used to relay electrical signals to and from the further die 1130.

The integrated circuit packaging system 1100 can have a top encapsulation 1124, a bottom encapsulation 1126, and an external interconnect 1128. The top encapsulation 1124 can be over, encapsulate, be directly on, or a combination thereof for the integrated circuit die 1118, the further die 1130, the further internal-connector 1137, the internal interconnect 1120, the under-fill 1122, a portion of the insulation cover 1112, or a combination thereof. The top encapsulation 1124 provides a hermetic seal for the integrated circuit die 1118 and does not cover an area of the insulation cover 1112 on a periphery of the top surface of the routing layer 1102.

The bottom encapsulation 1126 can encapsulate and be directly on the conductive land 1104 and can be between multiple instances of the conductive land 1104. A bottom surface of the bottom encapsulation 1126 can be coplanar with a bottom surface of the conductive land 1104. A bottom surface of the bottom encapsulation 1126 can be coplanar with the bottom cover 1108.

The bottom encapsulation 1126 can include a die support region 1127, which is an area of the bottom encapsulation 1126 below the integrated circuit die 1118 and between the multiple instances of the conductive land 1104 immediately adjacent to the integrated circuit die 1118. The die support region 1127 provides a platform and structural support for the integrated circuit die 1118 and the internal interconnect 1120, the under-fill 1122, the insulation cover 1112, and the metal connector 1106 below the integrated circuit die 1118.

The top encapsulation 1124 and the bottom encapsulation 1126 can be formed separately at different times during the manufacturing process. The insulation cover 1112, the metal connector 1106, the conductive land 1104, or a combination thereof can form a continuous horizontal barrier between the top encapsulation 1124 and the bottom encapsulation 1126, and isolate the two encapsulation structures.

The metal connector 1106 can run along or be embedded within a top surface of the bottom encapsulation 1126. The lateral edge 1107 of the metal connector 1106 can be covered by the bottom encapsulation 1126, the insulation cover 1112, or a combination thereof for providing structural rigidity, anchoring, and physical protection to the metal connector 1106.

The external interconnect 1128 can be a conductive structure for electrically coupling the integrated circuit packaging system 1100 to other structures, such as components or other packages. For example, the external interconnect 1128 can be a solder ball, conductive posts, lands, or a combination thereof. The external interconnect 1128 can be directly on the bottom portion of the conductive land 1104 at the bottom cover 1108.

The routing layer 1102 can include a component side 1151 for mounting components, devices, and packages. The routing layer 1102 can also include a system side 1153, which is a side opposite to the component side 1151, for connecting to a next system level (not shown).

The integrated circuit packaging system 1100 can include a peripheral mounting region 1155. The peripheral mounting region 1155 is the exposed area of a top surface of the insulation cover 1112 from an end of the top encapsulation 1124 to the outer boundary of the routing layer 1102. The peripheral mounting region 1155 is an area for attaching electrical interconnects to the metal connector 1106. Multiple instances of the connection opening 1114 can be formed in the insulation cover 1112 above the conductive land 1104 to provide electrical interconnection between components, devices, and packages as needed.

It has been discovered that the metal connector 1106 and the insulation cover 1112 provide the benefit of holding multiple instances of the conductive land 1104 in place during selective etching of the leadframe used to create the conductive land 1104 because the metal connector 1106 is made from a dissimilar material than the conductive land 1104. It has been discovered that the bottom encapsulation 1126 provides structural support between the conductive land 1104 and another of the conductive land 1104.

It has been discovered that the integrated circuit packaging system 1100 reduces package height by eliminating the need for a separate platform structure because the bottom encapsulation 1126 can provide structural support for the conductive land 1104, the metal connector 1106, the insulation cover 1112, and the integrated circuit die 1118. For example, the integrated circuit packaging system 1100 can be without an inner support portion, such as a substrate with pre-impregnated layers. It has been discovered that the bottom encapsulation 1126 with a thickness equal to or less than the thickness of the routing layer 1102 provides reduced package height in package-on-package configurations.

It has been discovered that the insulation cover 1112 and the bottom encapsulation 1126 prevent physical damage and displacement to the metal connector 1106. The insulation cover 1112 can cover a top surface of the metal connector 1106 and portions of the lateral edge 1107 of the metal connector 1106, which provides protection and anchoring. The bottom encapsulation 1126 can cover a bottom surface of the metal connector 1106 and portions of the lateral edge 1107 of the metal connector 1106, which provides protection and anchoring.

It has been discovered that the bottom encapsulation 1126 with the die support region 1127 provides support for the integrated circuit die 1118, devices, and other components mounted thereon. The die support region 1127 eliminates the need for paddles, which reduces the manufacturing complexity, reduces needed materials, and lowers manufacturing costs. It has been discovered that the multiple instances of the conductive land 1104 embedded in the bottom encapsulation 1126 prevents linear thermal expansion between the multiple instances of the conductive land 1104, preventing breakage and warpage of the integrated circuit packaging system 1100.

It has been discovered that the insulation cover 1112 over the metal connector 1106 provides protection against shorts and damages to the metal connector 1106 for portions of the metal connector 1106 that route into a grid-array away from the top encapsulation 1124. It has also been discovered that the conductive land 1104 having the overhang portion 1111 embedded into the bottom encapsulation 1126 provides improved mold lock capability. The overhang portion 1111 anchors the conductive land 1104 to the bottom encapsulation 1126 preventing lead pull-out.

Figure 12:
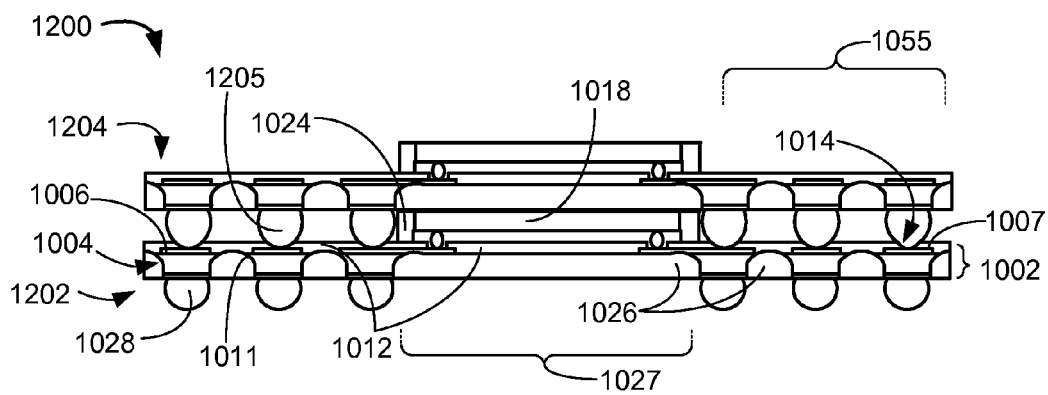
FIG. 12 is a cross-sectional view of an integrated circuit packaging system along a line 1-1 of FIG. 2 in a fourth embodiment of the present invention.

Referring now to FIG. 12, therein is shown a cross-sectional view of an integrated circuit packaging system 1200 along a line 1-1 of FIG. 2 in a fourth embodiment of the present invention.

The integrated circuit packaging system 1200 can be similar to the integrated circuit packaging system 1000 of FIG. 10 except the integrated circuit packaging system 1200 includes a stacked package 1204.

The integrated circuit packaging system 1200 can include a base package 1202. The base package 1202 can be similar to the integrated circuit packaging system 1000 including having identical elements. The base package 1202 can include multiple instances of the connection opening 1014 to match the electrical interconnects of the stacked package 1204.

The stacked package 1204 can be similar to the integrated circuit packaging system 1000 having identical elements. The top encapsulation 1024 of the base package 1202 can be in direct contact with the die support region 1027 of the stacked package 1204. The stacked package 1204 can include a stacked interconnect 1205.

The stacked interconnect 1205 can be similar to the external interconnect 1028. The stacked interconnect 1205 connects the stacked package 1204 to the metal connector 1006 at the connection opening 1014 of the base package 1202.

The external interconnect 1028 of the stacked package 1204 can be attached to the metal connector 1006 of the base package 1202 at the connection opening 1014 of the base package 1202. The stacked package 1204 can include multiple instances of the connection opening 1014 on the peripheral mounting region 1055.

The base package 1202 and the stacked package 1204 can be interchangeable with the other embodiments of the present invention. For example, the base package 1202 can have identical elements as the integrated circuit packaging system 100 of FIG. 1, the integrated circuit packaging system 1000, and the integrated circuit packaging system 1100 of FIG. 11. Further for example, the stacked package 1204 can have identical elements as the integrated circuit packaging system 100, the integrated circuit packaging system 1000, and the integrated circuit packaging system 1100.

It has been discovered that the metal connector 1006 and the insulation cover 1012 provide the benefit of holding multiple instances of the conductive land 1004 in place during selective etching of the leadframe used to create the conductive land 1004 because the metal connector 1006 is made from a dissimilar material than the conductive land 1004. It has been discovered that the bottom encapsulation 1026 provides structural support between the conductive land 1004 and another of the conductive land 1004.

It has been discovered that the integrated circuit packaging system 1200 reduces package height by eliminating the need for a separate platform structure because the bottom encapsulation 1026 can provide structural support for the conductive land 1004, the metal connector 1006, the insulation cover 1012, and the integrated circuit die 1018. For example, the integrated circuit packaging system 1200 can be without an inner support portion, such as a substrate with pre-impregnated layers. It has been discovered that the bottom encapsulation 1026 with a thickness equal to or less than the thickness of the routing layer 1002 provides reduced package height in package-on-package configurations.

It has been discovered that the insulation cover 1012 and the bottom encapsulation 1026 prevent physical damage and displacement to the metal connector 1006. The insulation cover 1012 can cover a top surface of the metal connector 1006 and portions of the lateral edge 1007 of the metal connector 1006, which provides protection and anchoring. The bottom encapsulation 1026 can cover a bottom surface of the metal connector 1006 and portions of the lateral edge 1007 of the metal connector 1006, which provides protection and anchoring.

It has been discovered that the bottom encapsulation 1026 with the die support region 1027 provides support for the integrated circuit die 1018, devices, and other components mounted thereon. The die support region 1027 eliminates the need for paddles, which reduces the manufacturing complexity, reduces needed materials, and lowers manufacturing costs. It has been discovered that the multiple instances of the conductive land 1004 embedded in the bottom encapsulation 1026 prevents linear thermal expansion between the multiple instances of the conductive land 1004, preventing breakage and warpage of the integrated circuit packaging system 1200.

It has been discovered that the insulation cover 1012 over the metal connector 1006 provides protection against shorts and damages to the metal connector 1006 for portions of the metal connector 1006 that route into a grid-array away from the top encapsulation 1024. It has also been discovered that the conductive land 1004 having the overhang portion 1011 embedded into the bottom encapsulation 1026 provides improved mold lock capability. The overhang portion 1011 anchors the conductive land 1004 to the bottom encapsulation 1026 preventing lead pull-out.

Figure 13:
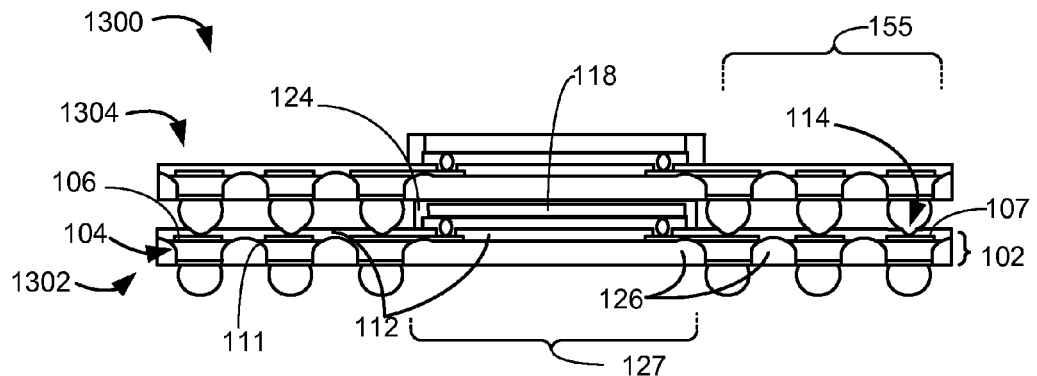
FIG. 13 is a cross-sectional view of an integrated circuit packaging system along a line 1-1 of FIG. 2 in a fifth embodiment of the present invention.

Referring now to FIG. 13, therein is shown a cross-sectional view of an integrated circuit packaging system 1300 along a line 1-1 of FIG. 2 in a fifth embodiment of the present invention.

The integrated circuit packaging system 1300 can be similar to the integrated circuit packaging system 100 of FIG. 1 except the integrated circuit packaging system 1300 includes a stacked package 1304.

The integrated circuit packaging system 1300 can include a base package 1302. The base package 1302 can be similar to the integrated circuit packaging system 100 including having identical elements. The base package 1302 can include multiple instances of the connection opening 114 to match the electrical interconnects of the stacked package 1304.

The stacked package 1304 can be similar to the integrated circuit packaging system 1000 of FIG. 10 having identical elements. The top encapsulation 124 of the base package 1302 can be in direct contact with the die support region 1027 of FIG. 10 of the stacked package 1304. The external interconnect 1028 of FIG. 10 of the stacked package 1304 can be attached to the metal connector 106 of the base package 1302 at the connection opening 114 of the base package 1302. The insulation cover 1012 of FIG. 10 of the stacked package 1304 can have no openings on the peripheral mounting region 155 to protect the metal connector 1006 of FIG. 10 on the stacked package 1304 on the top.

The base package 1302 and the stacked package 1304 can be interchangeable with the other embodiments of the present invention. For example, the base package 1302 can have identical elements as the integrated circuit packaging system 100, the integrated circuit packaging system 1000, and the integrated circuit packaging system 1100 of FIG. 11. Further for example, the stacked package 1304 can have identical elements as the integrated circuit packaging system 100, the integrated circuit packaging system 1000, and the integrated circuit packaging system 1100.

It has been discovered that the metal connector 106 and the insulation cover 112 provide the benefit of holding multiple instances of the conductive land 104 in place during selective etching of the leadframe used to create the conductive land 104 because the metal connector 106 is made from a dissimilar material than the conductive land 104. It has been discovered that the bottom encapsulation 126 provides structural support between the conductive land 104 and another of the conductive land 104.

It has been discovered that the integrated circuit packaging system 100 reduces package height by eliminating the need for a separate platform structure because the bottom encapsulation 126 can provide structural support for the conductive land 104, the metal connector 106, the insulation cover 112, and the integrated circuit die 118. For example, the integrated circuit packaging system 100 can be without an inner support portion, such as a substrate with pre-impregnated layers. It has been discovered that the bottom encapsulation 126 with a thickness equal to or less than the thickness of the routing layer 102 provides reduced package height in package-on-package configurations.

It has been discovered that the insulation cover 112 and the bottom encapsulation 126 prevent physical damage and displacement to the metal connector 106. The insulation cover 112 can cover a top surface of the metal connector 106 and portions of the lateral edge 107 of the metal connector 106, which provides protection and anchoring. The bottom encapsulation 126 can cover a bottom surface of the metal connector 106 and portions of the lateral edge 107 of the metal connector 106, which provides protection and anchoring.

It has been discovered that the bottom encapsulation 126 with the die support region 127 provides support for the integrated circuit die 118, devices, and other components mounted thereon. The die support region 127 eliminates the need for paddles, which reduces the manufacturing complexity, reduces needed materials, and lowers manufacturing costs. It has been discovered that the multiple instances of the conductive land 104 embedded in the bottom encapsulation 126 prevents linear thermal expansion between the multiple instances of the conductive land 104, preventing breakage and warpage of the integrated circuit packaging system 100.

It has been discovered that the insulation cover 112 over the metal connector 106 provides protection against shorts and damages to the metal connector 106 for portions of the metal connector 106 that route into a grid-array away from the top encapsulation 124. It has also been discovered that the conductive land 104 having the overhang portion 111 embedded into the bottom encapsulation 126 provides improved mold lock capability. The overhang portion 111 anchors the conductive land 104 to the bottom encapsulation 126 preventing lead pull-out.

Figure 14:
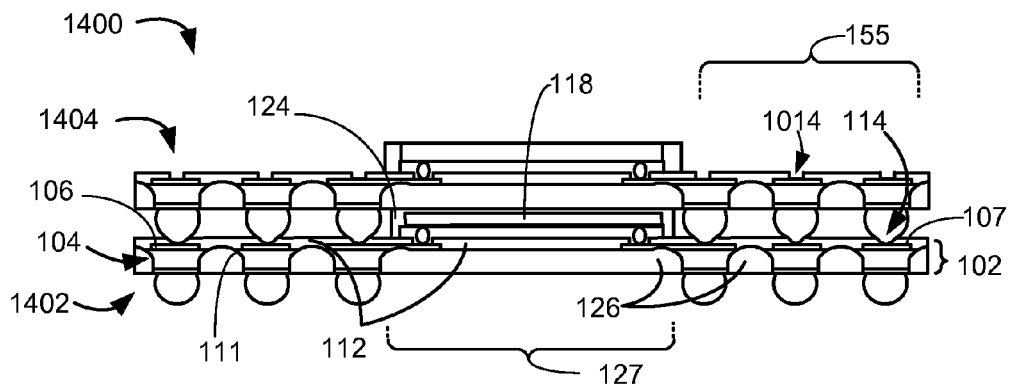
FIG. 14 is a cross-sectional view of an integrated circuit packaging system along a line 1-1 of FIG. 2 in a sixth embodiment of the present invention.

Referring now to FIG. 14, therein is shown a cross-sectional view of an integrated circuit packaging system 1400 along a line 1-1 of FIG. 2 in a sixth embodiment of the present invention.

The integrated circuit packaging system 1400 can be similar to the integrated circuit packaging system 100 of FIG. 1 except the integrated circuit packaging system 1400 includes a stacked package 1404.

The integrated circuit packaging system 1400 can include a base package 1402. The base package 1402 can be similar to the integrated circuit packaging system 100 including having identical elements. The base package 1402 can include multiple instances of the connection opening 114 to match the electrical interconnects of the stacked package 1404.

The stacked package 1404 can be similar to the integrated circuit packaging system 1000 of FIG. 10 having identical elements. The top encapsulation 124 of the base package 1402 can be in direct contact with the die support region 1027 of FIG. 10 of the stacked package 1404. The stacked package 1404 can have multiple instances of the connection opening 1014 at each instance of the conductive land 104 of the base package 1402.

The external interconnect 1028 of FIG. 10 of the stacked package 1404 can be attached to the metal connector 106 of the base package 1402 at the connection opening 114 of the base package 1402. The stacked package 1404 can include multiple instances of the connection opening 1014 on the peripheral mounting region 155.

The base package 1402 and the stacked package 1404 can be interchangeable with the other embodiments of the present invention. For example, the base package 1402 can have identical elements as the integrated circuit packaging system 100, the integrated circuit packaging system 1000, and the integrated circuit packaging system 1100 of FIG. 11. Further for example, the stacked package 1404 can have identical elements as the integrated circuit packaging system 100, the integrated circuit packaging system 1000, and the integrated circuit packaging system 1100.

It has been discovered that the metal connector 106 and the insulation cover 112 provide the benefit of holding multiple instances of the conductive land 104 in place during selective etching of the leadframe used to create the conductive land 104 because the metal connector 106 is made from a dissimilar material than the conductive land 104. It has been discovered that the bottom encapsulation 126 provides structural support between the conductive land 104 and another of the conductive land 104.

It has been discovered that the integrated circuit packaging system 100 reduces package height by eliminating the need for a separate platform structure because the bottom encapsulation 126 can provide structural support for the conductive land 104, the metal connector 106, the insulation cover 112, and the integrated circuit die 118. For example, the integrated circuit packaging system 100 can be without an inner support portion, such as a substrate with pre-impregnated layers. It has been discovered that the bottom encapsulation 126 with a thickness equal to or less than the thickness of the routing layer 102 provides reduced package height in package-on-package configurations.

It has been discovered that the insulation cover 112 and the bottom encapsulation 126 prevent physical damage and displacement to the metal connector 106. The insulation cover 112 can cover a top surface of the metal connector 106 and portions of the lateral edge 107 of the metal connector 106, which provides protection and anchoring. The bottom encapsulation 126 can cover a bottom surface of the metal connector 106 and portions of the lateral edge 107 of the metal connector 106, which provides protection and anchoring.

It has been discovered that the bottom encapsulation 126 with the die support region 127 provides support for the integrated circuit die 118, devices, and other components mounted thereon. The die support region 127 eliminates the need for paddles, which reduces the manufacturing complexity, reduces needed materials, and lowers manufacturing costs. It has been discovered that the multiple instances of the conductive land 104 embedded in the bottom encapsulation 126 prevents linear thermal expansion between the multiple instances of the conductive land 104, preventing breakage and warpage of the integrated circuit packaging system 100.

It has been discovered that the insulation cover 112 over the metal connector 106 provides protection against shorts and damages to the metal connector 106 for portions of the metal connector 106 that route into a grid-array away from the top encapsulation 124. It has also been discovered that the conductive land 104 having the overhang portion 111 embedded into the bottom encapsulation 126 provides improved mold lock capability. The overhang portion 111 anchors the conductive land 104 to the bottom encapsulation 126 preventing lead pull-out.

Figure 15:
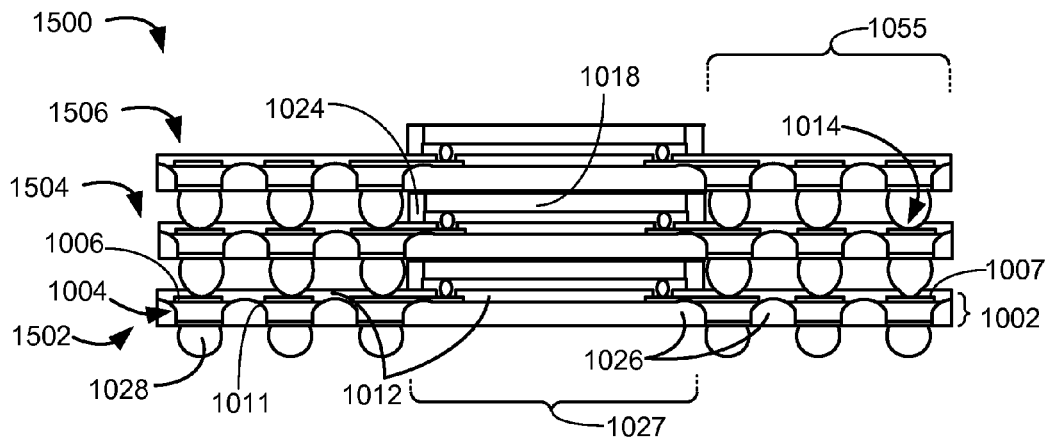
FIG. 15 is a cross-sectional view of an integrated circuit packaging system along a line 1-1 of FIG. 2 in a seventh embodiment of the present invention.

Referring now to FIG. 15, therein is shown a cross-sectional view of an integrated circuit packaging system 1500 along a line 1-1 of FIG. 2 in a seventh embodiment of the present invention.

The integrated circuit packaging system 1500 can be similar to the integrated circuit packaging system 1000 of FIG. 10 except the integrated circuit packaging system 1500 includes a stacked package 1504 and a further stacked package 1506.

The integrated circuit packaging system 1500 can include a base package 1502. The base package 1502 can be similar to the integrated circuit packaging system 1000 including having identical elements. The base package 1502 can include multiple instances of the connection opening 1014 to match the electrical interconnects of the stacked package 1504.

The stacked package 1504 can be similar to the integrated circuit packaging system 1000 having identical elements. The top encapsulation 1024 of the base package 1502 can be in direct contact with the die support region 1027 of the stacked package 1504. The external interconnect 1028 of the stacked package 1504 can be attached to the metal connector 1006 of the base package 1502 at the connection opening 1014 of the base package 1502. The stacked package 1504 can include multiple instances of the connection opening 1014 on the peripheral mounting region 1055.

The further stacked package 1506 can be similar to the stacked package 1504 having identical elements. The further stacked package 1506 can be mounted on the stacked package 1504.

The base package 1502, the stacked package 1504, and the further stacked package 1506 can be interchangeable with the other embodiments of the present invention. For example, the base package 1502 can have identical elements as the integrated circuit packaging system 100 of FIG. 1, the integrated circuit packaging system, and the integrated circuit packaging system 1100 of FIG. 11. Further for example, the stacked package 1504 can have identical elements as the integrated circuit packaging system 100, the integrated circuit packaging system 1000, and the integrated circuit packaging system 1100. Still further for example, the further stacked package 1506 can have identical elements as the integrated circuit packaging system 100, the integrated circuit packaging system 1000, and the integrated circuit packaging system 1100.

It has been discovered that the metal connector 1006 and the insulation cover 1012 provide the benefit of holding multiple instances of the conductive land 1004 in place during selective etching of the leadframe used to create the conductive land 1004 because the metal connector 1006 is made from a dissimilar material than the conductive land 1004. It has been discovered that the bottom encapsulation 1026 provides structural support between the conductive land 1004 and another of the conductive land 1004.

It has been discovered that the integrated circuit packaging system 1000 reduces package height by eliminating the need for a separate platform structure because the bottom encapsulation 1026 can provide structural support for the conductive land 1004, the metal connector 1006, the insulation cover 1012, and the integrated circuit die 1018. For example, the integrated circuit packaging system 1000 can be without an inner support portion, such as a substrate with pre-impregnated layers. It has been discovered that the bottom encapsulation 1026 with a thickness equal to or less than the thickness of the routing layer 1002 provides reduced package height in package-on-package configurations.

It has been discovered that the insulation cover 1012 and the bottom encapsulation 1026 prevent physical damage and displacement to the metal connector 1006. The insulation cover 1012 can cover a top surface of the metal connector 1006 and portions of the lateral edge 1007 of the metal connector 1006, which provides protection and anchoring. The bottom encapsulation 1026 can cover a bottom surface of the metal connector 1006 and portions of the lateral edge 1007 of the metal connector 1006, which provides protection and anchoring.

It has been discovered that the bottom encapsulation 1026 with the die support region 1027 provides support for the integrated circuit die 1018, devices, and other components mounted thereon. The die support region 1027 eliminates the need for paddles, which reduces the manufacturing complexity, reduces needed materials, and lowers manufacturing costs. It has been discovered that the multiple instances of the conductive land 1004 embedded in the bottom encapsulation 1026 prevents linear thermal expansion between the multiple instances of the conductive land 1004, preventing breakage and warpage of the integrated circuit packaging system 1000.

It has been discovered that the insulation cover 1012 over the metal connector 1006 provides protection against shorts and damages to the metal connector 1006 for portions of the metal connector 1006 that route into a grid-array away from the top encapsulation 1024. It has also been discovered that the conductive land 1004 having the overhang portion 1011 embedded into the bottom encapsulation 1026 provides improved mold lock capability. The overhang portion 1011 anchors the conductive land 1004 to the bottom encapsulation 1026 preventing lead pull-out.

Figure 16:
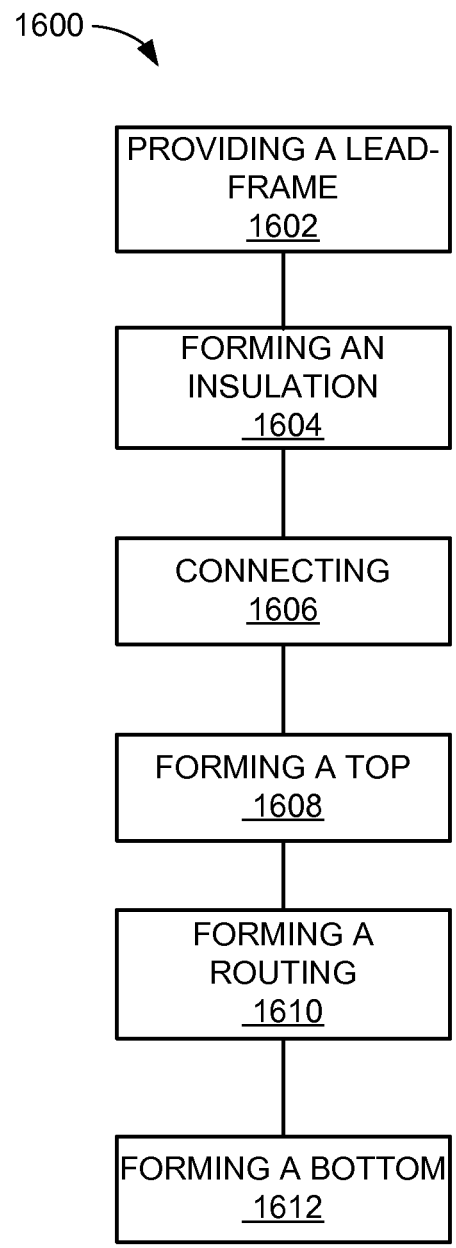
FIG. 16 is a flow chart of a method for manufacture of an integrated circuit packaging system of FIG. 1 in a further embodiment of the present invention.

Referring now to FIG. 16, therein is shown a flow chart of a method 1600 for manufacture of an integrated circuit packaging system 100 of FIG. 1 in a further embodiment of the present invention. The method 1600 includes: providing a lead-frame having a metal connector mounted thereon and having a peripheral mounting region in a block 1602; forming an insulation cover on the lead-frame and on the metal connector in a block 1604; connecting an integrated circuit die over the insulation cover in a block 1606; forming a top encapsulation on the integrated circuit die with the peripheral mounting region exposed from the top encapsulation in a block 1608; forming a routing layer, having a conductive land, from the lead-frame in a block 1610; and forming a bottom encapsulation partially encapsulating the routing layer and the insulation cover in a block 1612.

Yet other important aspects of the embodiments include that it valuably supports and services the historical trend of reducing costs, simplifying systems, and increasing performance. These and other valuable aspects of the embodiments consequently further the state of the technology to at least the next level.

Thus, it has been discovered that the integrated circuit packaging system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit packaging system.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a lead-frame having a metal connector mounted thereon and having a peripheral mounting region;
   forming an insulation cover on the lead-frame and on the metal connector;
   connecting an integrated circuit die over the insulation cover;
   forming a top encapsulation on the integrated circuit die with the peripheral mounting region laterally adjacent to the top encapsulation;
   forming a routing layer, having a conductive land, from the lead-frame; and
   forming a bottom encapsulation partially encapsulating the routing layer and the insulation cover.

2. The method as claimed in claim 1 wherein forming the top encapsulation includes forming the top encapsulation with a top chip surface of the integrated circuit die exposed from the top encapsulation.

3. The method as claimed in claim 1 wherein forming the bottom encapsulation includes forming the bottom encapsulation encapsulating a lateral edge of the metal connector.

4. The method as claimed in claim 1 further comprising:
   mounting a further die on the integrated circuit die; and
   wherein:
   forming the top encapsulation includes forming the top encapsulation on the further die.

5. The method as claimed in claim 1 further comprising mounting a stacked package, having a stack interconnect, over the top encapsulation, the stack interconnect mounted to the metal connector.

6. A method of manufacture of an integrated circuit packaging system comprising:
   providing a lead-frame having a metal connector mounted thereon and having a peripheral mounting region;
   forming an insulation cover on the lead-frame and on the metal connector;
   connecting an integrated circuit die over the insulation cover;
   forming an under-fill between the integrated circuit die and the insulation cover;
   forming a top encapsulation on the integrated circuit die with the peripheral mounting region laterally adjacent to the top encapsulation;
   forming a routing layer, having a conductive land, from the lead-frame; and
   forming a bottom encapsulation partially encapsulating the routing layer and the insulation cover.

7. The method as claimed in claim 6 further comprising forming a connection opening in the insulation cover for exposing a portion of the metal connector.

8. The method as claimed in claim 6 wherein forming the bottom encapsulation includes forming the bottom encapsulation coplanar to a bottom cover of the conductive land.

9. The method as claimed in claim 6 wherein forming the bottom encapsulation includes forming the bottom encapsulation isolated from the top encapsulation.

10. The method as claimed in claim 6 wherein connecting the integrated circuit die includes connecting a flip chip.

11. An integrated circuit packaging system comprising:
   a routing layer having a conductive land, a metal connector, and a peripheral mounting region, the metal connector on the conductive land;
   an insulation cover on the routing layer;
   an integrated circuit die mounted over the insulation cover;
   a top encapsulation encapsulating the integrated circuit die with the peripheral mounting region laterally adjacent to the top encapsulation; and
   a bottom encapsulation partially encapsulating the routing layer and the insulation cover.

12. The system as claimed in claim 11 wherein the integrated circuit die includes a top chip surface exposed from the top encapsulation.

13. The system as claimed in claim 11 wherein the bottom encapsulation encapsulates a lateral edge of the metal connector.

14. The system as claimed in claim 11 further comprising:
   a further die mounted on the integrated circuit die; and
   wherein:
   the top encapsulation encapsulates the further die.

15. The system as claimed in claim 11 further comprising a stacked package, having a stacked interconnect, over the top encapsulation, the stack interconnect mounted to the metal connector.

16. The system as claimed in claim 11 further comprising an under-fill between the integrated circuit die and the insulation cover.

17. The system as claimed in claim 16 wherein the insulation cover includes a connection opening for exposing a portion of the metal connector.

18. The system as claimed in claim 16 wherein the bottom encapsulation is coplanar with a bottom cover of the conductive land.

19. The system as claimed in claim 16 wherein the bottom encapsulation is isolated from the top encapsulation.

20. The system as claimed in claim 16 wherein the integrated circuit die is a flip chip.

* * * * *